United States Patent [19]
Callahan

[11] Patent Number: 5,494,180
[45] Date of Patent: Feb. 27, 1996

[54] HYBRID RESISTANCE CARDS AND METHODS FOR MANUFACTURING SAME

[75] Inventor: Stephen A. Callahan, Mesa, Ariz.

[73] Assignee: McDonnell Douglas Helicopter Company, Mesa, Ariz.

[21] Appl. No.: 312,282

[22] Filed: Sep. 26, 1994

Related U.S. Application Data

[62] Division of Ser. No. 904,331, Jun. 25, 1992, Pat. No. 5,364,705.

[51] Int. Cl.$^6$ .................................................. H01C 10/10
[52] U.S. Cl. ........................... 216/16; 427/102; 427/103; 29/620
[58] Field of Search ............................. 216/16; 29/620, 29/610.1; 427/102, 101, 103

[56] References Cited

U.S. PATENT DOCUMENTS

| | | | |
|---|---|---|---|
| 3,287,161 | 11/1966 | Schwertz et al. | 117/212 |
| 3,629,776 | 12/1971 | Watano | 338/140 |
| 4,126,824 | 11/1978 | Thornburg et al. | 338/25 |
| 4,243,969 | 1/1981 | Steigerwald et al. | 338/309 |
| 4,284,970 | 8/1981 | Berrin et al. | 338/195 |
| 4,448,806 | 5/1984 | Levinson | 427/102 |
| 4,604,298 | 8/1986 | Shevtchuk et al. | 427/96 |
| 4,626,822 | 12/1986 | Melkeraaen | 338/309 |
| 4,630,025 | 12/1986 | Bourolleau | 338/309 |
| 4,665,377 | 5/1987 | Harpaintner | 338/195 |
| 4,888,089 | 12/1989 | Marstiller et al. | 216/16 |
| 4,931,764 | 6/1990 | Gaston | 338/185 |
| 5,126,716 | 6/1992 | Munger | 338/306 |

*Primary Examiner*—Thi Dang
*Attorney, Agent, or Firm*—Donald E. Stout

[57] ABSTRACT

A hybrid resistance card (R-Card) is manufactured using a two-step process wherein an electrically conductive ink layer and an electrically resistive ink layer are printed onto a surface, which may be either a substrate or the part on which the R-Card is to be used. The conductive ink layer is selectively applied in a pattern of shapes to electrically short out portions of the resistive ink layer, thereby permitting the R-Card to have a predetermined resistive taper across its width according to a desired resistivity curve. The resistive ink layer comprises grid-like lines bordering and separating the conductive shapes. The resistive taper is substantially continuous along the length of the R-Card, at least linearly, though if the card is designed to cover an entire part, it is substantially continuous along a plurality of directions on the card, with the tapers being designed to round into one another. The inventive process permits much greater uniformity and predictability of result, as well as producing a much more versatile card, and is also much less expensive than currently employed processes.

13 Claims, 2 Drawing Sheets

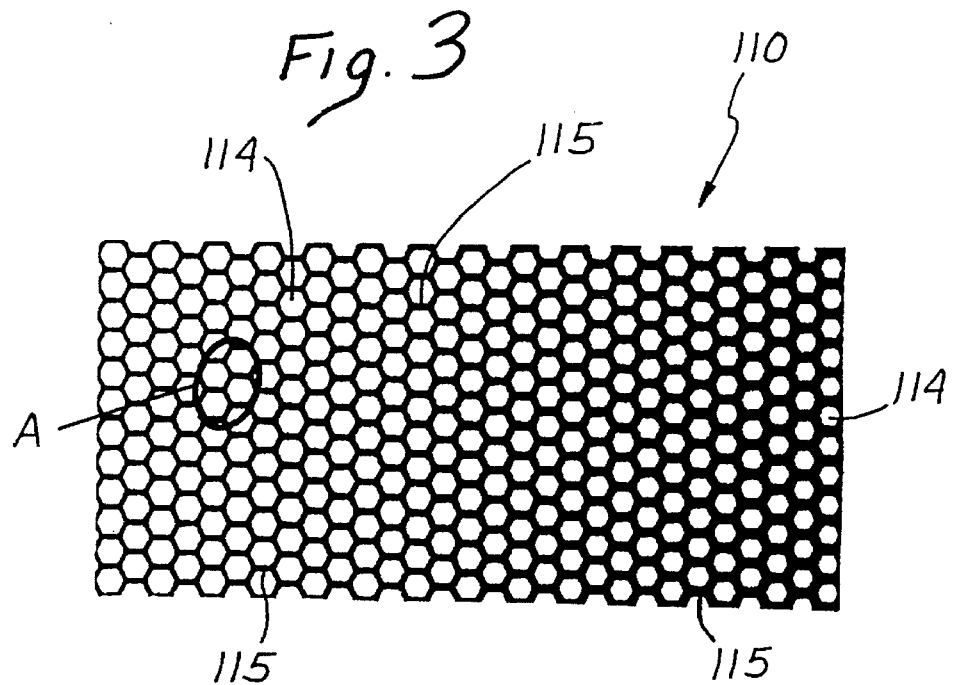
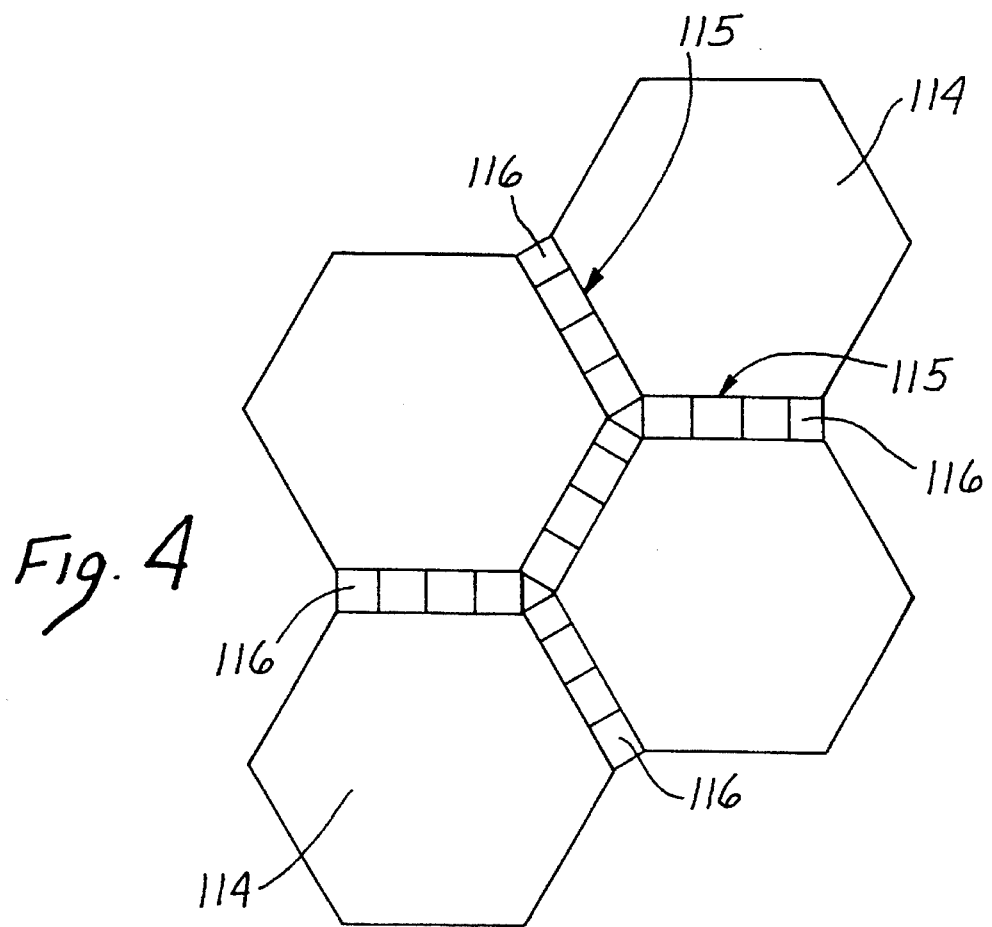

HYBRID RESISTANCE CARDS AND METHODS FOR MANUFACTURING SAME

This is a division of application Ser. No. 07/904,331, filed 25 Jun. 1992, now U.S. Pat. No. 5,364,705.

BACKGROUND OF THE INVENTION

This invention relates to variable resistance cards, and more particularly to hybrid resistance cards (R-Cards) which are more versatile and adaptable, yet less expensive, than existing R-Cards, and methods for manufacturing same using a two-step printing process involving conductive and resistive inks.

R-Cards are a tapered resistive sheet, useful in a number of diverse applications. As shown in the prior art FIGS. 1 and 2, in a state of the art R-Card 10, the electrical resistivity is tapered across the width of the sheet 12, ranging from a relatively high (approximately air) resistance to a relatively low (approximately metal) resistance, following a desired resistivity curve (see FIG. 2). This resistive taper is repeated along the entire length of the sheet 12. Currently, a number of manufacturing processes are used to produce R-Cards. One of the most prevalent methods is to evaporate a conductive metal onto a kapton substrate. Another prevalent method involves sputtering onto a scrim material. Yet another method involves spraying material onto a substrate. However, these processes are not consistent from production lot to lot. Additionally, only linear lengths can be manufactured using the evaporated or sputtering method, since it is only possible to make an end-to-end taper, rather than being able to taper the resistance in any direction. Consequently, corners cannot be made in a continuous piece. As a result, R-Cards currently are mitered to cover curved surfaces, which is expensive, time consuming, and can be a source of performance degradation, since entire parts cannot be covered with one card.

Additional problems plaguing current state of the art R-Cards are numerous. Among them is that the resistivity curves that R-Cards currently follow are empirically manufactured at best. Current methods do not allow for flexibility in choosing the best substrate for the application. Furthermore, current production methods are very limited with regard to the high and low end resistances.

What is needed, therefore, are new manufacturing processes which will produce R-Cards that can smoothly follow a curvature without mitering, enabling coverage of an entire part with a single R-Card. Also needed are methods for producing R-Cards which can follow any resistivity curve accurately and which can be designed to start and stop at particular resistances. Most importantly, what is needed is a relatively low cost production process which produces consistently high quality R-Cards in every production run.

SUMMARY OF THE INVENTION

This invention solves the problem outlined above by employing new manufacturing processes wherein the resistive and conductive materials forming the desired resistivity taper along the R-Card are printed onto the card. A two step process is used wherein either both materials are applied using a silk screening process, or, alternatively, one material is etched and the other material is subsequently silk screened onto the card. Furthermore, the process may be varied, producing either cards used for treating only the edges of a part, or producing cards which can smoothly follow a surface curvature without mitering, thereby allowing coverage of an entire part with a single R-Card. The result of any of the above-described variants of the inventive process is an R-Card which can follow any resistivity curve and which can be designed to start and stop at particular resistances. Furthermore, the production process is much lower in cost than current state of the art processes and it produces consistently high quality R-Cards in virtually every production run.

Elaborating on the above description, the hybrid resistance card (R-Card) which is produced has both an electrically conductive ink layer and an electrically resistive ink layer. The conductive ink layer is selectively applied in a pattern to electrically short out portions of the resistive ink layer, thereby permitting the R-Card to have a predetermined resistive taper across its width according to a desired resistivity curve. The conductive ink layer is applied in a pattern of shapes, preferably polygons, and the resistive ink layer is applied in a sheet which forms a grid-like pattern of lines bordering and separating the conductive shapes. The resistive taper is substantially continuous along the length of the R-Card, at least linearly, though if the card is designed to cover an entire part, the resistive taper is substantially continuous along a plurality of directions on the card, with the tapers being designed to round into one another. The ink layers may be printed either onto a substrate, such as quartz glass or S-glass, or they may be printed directly onto the part to be covered.

An important aspect of the invention is the ability to accurately follow any desired resistivity curve on a theoretical, rather than empirical basis, and to design the card to start and stop at predetermined desired resistances, which are dependent upon the particular application to which the card will be applied. Accordingly, the width of the lines comprising the resistive ink layer determines the resistivity of the card, such that the lines are relatively thin in areas of the card having relatively low resistivity and are relatively wide in areas of the card having relatively high resistivity. The width of the lines and size of the conductive ink layer shapes can be calculated for any desired resistance values using known equations, permitting the manufacture of R-Cards having extremely accurate and predictable resistance values and tapers.

In another aspect of the invention, a method of making a hybrid R-Card like that disclosed above is set forth, the method comprising the steps of printing a conductive ink layer and a resistive ink layer onto a surface. The conductive ink layer is selectively applied to electrically short out portions of the resistive ink layer, thereby permitting the card to have a predetermined resistive taper across its width, with the taper being substantially continuous along the length of the R-Card, at least in a linear direction. The steps of printing the conductive and resistive ink layers onto the surface include the steps of: a) silk screening the conductive ink layer onto the surface, so that the conductive ink layer comprises a plurality of predetermined shapes repeated along the length of the card; b) heat curing the conductive ink layer; c) silk screening the resistive ink layer onto the surface so that it covers the conductive layer, forming a grid-like pattern of lines bordering and separating the predetermined shapes; and d) heat curing the resistive ink layer. It is noted that it is equally preferable to first silk screen the resistive ink layer onto the surface, followed by the step of silk screening the conductive ink layer. Which layer is first silk screened onto the surface is immaterial to the function of the resultant R-Card.

In an alternative method, a metalized substrate may be employed, onto which the conductive layer is etched. Following this, the resistive ink layer is silk screened onto the substrate, after which it is heat cured. This method would be preferable in instances where greater resolution were required, though the method is slower and more costly than the two-step silk screening process.

The above mentioned and other objects and features of this invention and the manner of attaining them will become apparent, and the invention itself will be best understood, by reference to the following description taken in conjunction with the accompanying illustrative drawings.

BRIEF DESCRIPTION OF THE DRAWINGS

FIG. 3 is a plan view showing a representative portion of a hybrid R-Card of the invention, with the conductive ink layer shown in white and the resistive ink layer shown in black; and FIG. 4 is an enlarged detailed view of the portion of FIG. 3 designated by reference letter A, showing in greater detail the conductive ink layer hexagons and the resistive ink layer lines spacing the conductive hexagons.

DETAILED DESCRIPTION OF THE DRAWINGS

Figure 1:
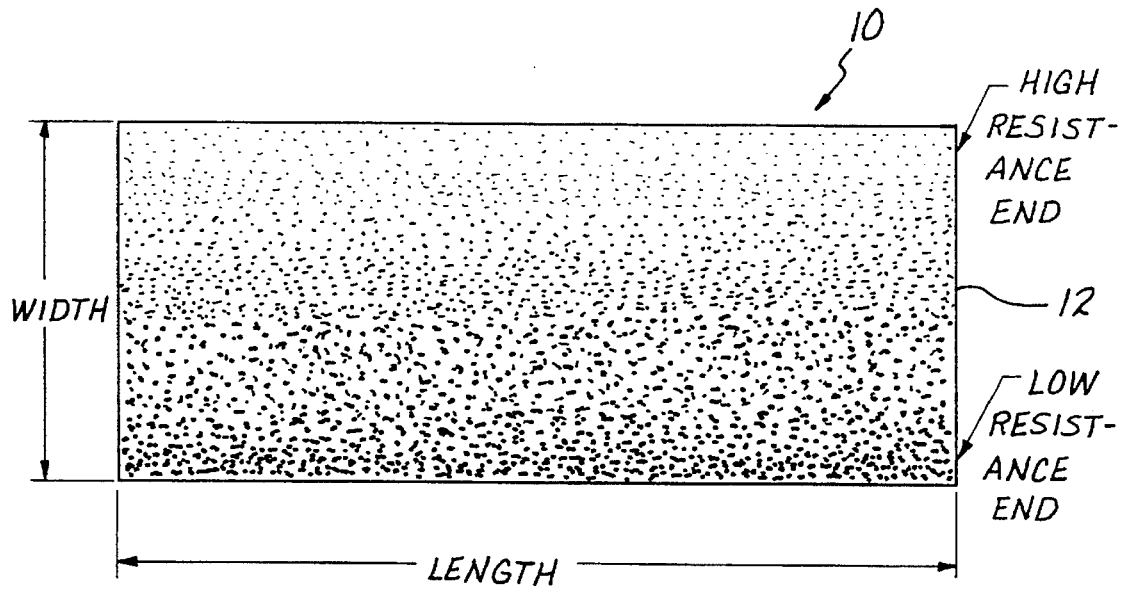
FIG. 1 is a diagrammatic view of a prior art R-Card, showing the resistive taper, by means of shading, across the width of the card.
Figure 2:
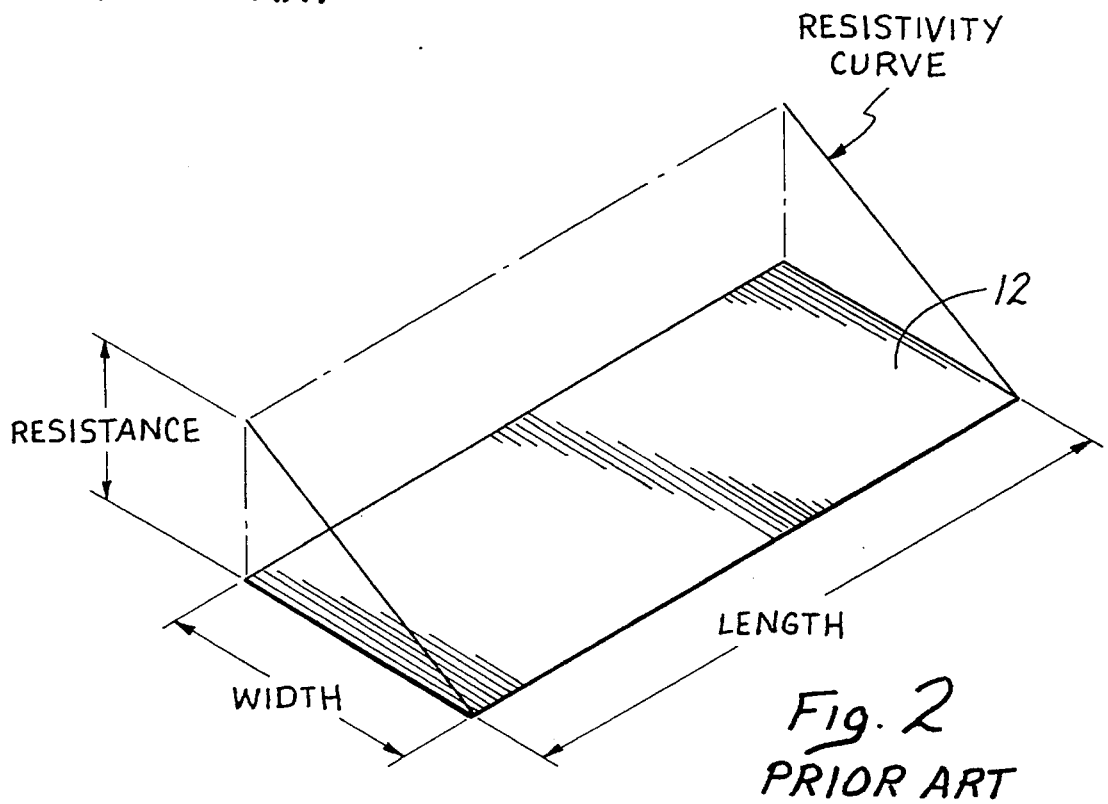
FIG. 2 is a perspective view of a prior art R-Card, showing the resistivity curve across the width of the card.

Referring now to FIG. 3, a typical hybrid R-Card 110 made by the claimed inventive method is shown. The hybrid R-Card 110 is designed to function in the same manner as a prior art R-Card described in the Background of the Invention, but with greater accuracy and control over the resistive taper. The accuracy is controlled by using a two-step process, involving both resistive and conductive hybrid inks which are printed on a surface, preferably a substrate material, in either a conductor over the resistor or a resistor over the conductor configuration. In the preferred embodiment, the resistive ink has a constant value of N Ohms/Square when the ink thickness is kept constant. The conductive ink, used to short out regions in the resistive ink, is applied in a pattern that is preferably made up of either 3, 4, or 6-sided polygons 114, although other shapes can be used as well, in combinations to form the necessary repeating pattern. In FIG. 3, a typical repeating pattern is shown using polygons 114, which in this instance are hexagonal. The conductive ink layer is shown in white, while the resistive ink layer, which comprises the lines 115 between the polygons 114, is shown in black.

The set of polygons 114 is determined by the length of the resistive taper needed and the desired ohmic end values. The polygons are laid out in a pattern to control the distance between each one. The size of the polygons either grows or shrinks around a grid that depends on the highest frequency for card operation, with the maximum size of each polygon 114 being one-tenth the wavelength of the operating frequency. As can be seen In FIG. 3, by observing the relative thicknesses of the lines 115 between the polygons 114, the resistivity of the card increases along its width from left to right, with the left side being the lower resistance end and the right side being the higher resistance end.

FIG. 4 represents a detailed enlargement of the section of FIG. 3 designated by the reference letter A. The hexagons 114 comprise the conductive ink layer. The desired resistance of the resistive ink layer 115 can be determined by knowing the length of the polygon sides and the spacing between each polygon 114. From this the resistance can be calculated by knowing the number of squares 116 along each side that are in parallel. The size of the polygons 114 depends upon the resistance value desired, which In turn depends upon the number of squares needed. FIG. 4 shows how the number of squares 116 is determined. To calculate the resistance, the following equation is employed:

$$R = 1/(1/R_{ink})N \quad (1)$$

where R is the resistance, $R_{ink}$ is the resistive value of the hybrid ink in Ohms/Square and N is the number of squares between conductive hexagons. For instance, if $R_{ink}$=2000 Ohms/Square and N=4.25 squares, as shown in the FIG. 4 example, R would be calculated as follows:

$$R = 1/(1/2000)4.25 = 470.588 \text{ Ohms} \quad (2)$$

Design Process

The design process for the inventive hybrid R-Card 110 varies depending upon whether the card is to be used to treat the edges of a part or whether it is to be used to treat an entire part with only one card.

The design of edge treating R-Cards require the following information: length of the taper, low end resistance, high end resistance, and the equation for the desired resistivity curve. Then, using equation (1) above, the required spacing between the polygons 114 and the size of each polygon 114 along the taper can be calculated. The maximum size of the polygons 114 are determined by the highest frequency for which the R-Card 110 will be used and is at a maximum one-tenth of that frequency's wavelength. The smallest polygon is one half the size of the largest. Once this information is obtained, the polygons 114 are drawn on a grid system where the polygons are centered on each grid point. After the drawing work is finished, preferably on a Computer-Aided-Design (CAD) system or the like, art work is made so that a part's conductive layer can either be silk screened or etched. After silk screening or etching, the resistive ink is silk screened over the entire part. If the conductive layer is to be silk screened, then it is not necessary for it to be the first layer of the R-Card.

The design of R-Cards 114 suitable for covering an entire part requires the following information: the length of the taper desired on all sides, low end resistance(s), high end resistance(s), the equation for the desired resistivity curve for the taper to follow, and the outside dimensions of the part. Then, using equation (1) above, the required spacing between the polygons 114 and the size of each polygon along the taper can be calculated. The maximum size of the polygons 114 are determined by the highest frequency for which the R-Card 110 will be used and is at a maximum one-tenth of that frequency's wavelength. The smallest polygon is one half the size of the largest. From this data, the part design is laid out, preferably on a CAD system where tapers round into each other, instead of forming a mitered corner on a grid system where the polygons are centered on each grid point. After the CAD work is finished, art work is made so a part's conductive layer can either be silk screened or etched. After silk screening or etching, the resistive ink is silk screened over the entire part. As in the case of edge-treating cards, if the conductive layer is to be silk screened, then it is not necessary for it to be the first layer of the R-Card.

Fabrication of the R-Card

The R-Card 110 is fabricated in a two-step process that either involves two silk screening steps or one silk screening step and one etching step. The silk screening process which is employed is a known prior art process which is of the type used for electronic hybrid circuits and membrane switches.

The preferred process is a two step silk screening process in which both the conductive layer and the resistive layer is silk screened. The silk screening process can be printed on a variety of different substrates, including kapton or polyester, or even directly on the part, without a substrate, though in the preferred embodiment a quartz glass or S-glass substrate is employed. The substrate is generally of a one laminate thickness, with a polyamide resin. Any of these substrates require that the surfaces be clean before printing. The art work from the design process is then used to make a silk screen for printing the conductive layer. Once the conductive layer is printed, it is then cured by heat. After the cure, the resistive layer is printed covering the entire conductive layer and then cured. It should be noted that it is equally preferable to print the conductive layer over the resistive layer rather than the resistive layer over the conductive layer, as it makes no difference to the function of the resulting R-Card.

Under certain circumstances, it may be preferable to employ an alternative process, involving one silk screening step and one etching step. Such a process requires that the substrate be metalized. The first step is the etching process, and can vary depending upon the type of metal on the substrate. After the etching process, the resistive layer is printed over the etched surface and then cured by heat. This etching process costs more than the preferred silk screening process, but is used where greater resolution is necessary.

The primary novelty in the above disclosed processes is the use of hybrid inks with a resistor being shorted out by conductive polygons or other entities in a manner to control the resistive taper to any given equation. Secondarily, R-Cards 110 produced by this technique can be designed to wrap around corners or cover entire two or three dimensional parts while controlling the resistive taper.

Although an exemplary embodiment of the invention has been shown and described, many changes, modifications, and substitutions may be made by one having ordinary skill in the art without departing from the spirit and scope of the invention.

What is claimed is:

1. A method of making a hybrid R-Card having both a length and a width, comprising the steps of applying a conductive ink layer and a resistive ink layer onto a surface, said conductive ink layer being selectively applied to electrically short out portions of said resistive ink layer, thereby permitting the card to have a predetermined resistive taper across the width thereof according to a desired resistivity curve, with the resistive taper being substantially continuous along the length of the R-Card.

2. The method as recited in claim 1, wherein the steps of applying said conductive ink layer and said resistive ink layer onto the surface include the following steps:
    a) silk screening the conductive ink layer onto the surface, such that the conductive ink layer comprises a plurality of predetermined shapes repeated along the length of the card;
    b) heat curing the conductive ink layer;
    c) silk screening the resistive ink layer onto the surface, such that it forms a grid-like pattern of lines bordering and separating said predetermined shapes; and
    d) heat curing the resistive ink layer.

3. The method as recited in claim 1, wherein for a desired resistivity taper, the required width of the resistive ink lines separating said predetermined shapes and the size of said shapes at any particular location on the R-Card is calculated by the following equation:

$$R = 1/(1/R_{ink})N \tag{1}$$

where R is the resistance, $R_{ink}$ is the resistive value of the hybrid ink in Ohms/Square and N is the number of squares between conductive hexagons.

4. The method as recited in claim 3, wherein said predetermined shapes comprise polygons, the maximum size of said polygons being equal to one-tenth of the wavelength of the highest frequency for which the R-Card is employed, and the minimum size of said polygons being equal to one-half the size of the largest polygons.

5. The method as recited in claim 1, wherein said conductive and resistive ink layers are printed onto a substrate material.

6. The method as recited in claim 1, wherein said conductive and resistive ink layers are printed directly onto the part to be covered by the R-Card.

7. The method as recited in claim 1, wherein said surface comprises a metalized substrate, the steps of applying said conductive ink layer and said resistive ink layer onto the surface including the following steps:
    a) etching the conductive layer on the metalized substrate, such that the conductive layer comprises a plurality of predetermined shapes repeated along the length of the card;
    b) silk screening the resistive ink layer onto the metalized substrate, such that it comprises a grid-like pattern of lines bordering and separating said predetermined shapes; and
    c) heat curing the resistive ink layer.

8. The method as recited in claim 1, wherein the R-Card is made such that the resistive taper is substantially continuous along a plurality of directions on said R-Card, the tapers being designed to round into one another, thereby allowing a single said R-Card to cover an entire part.

9. The method as recited in claim 1, wherein the steps of printing said conductive ink layer and said resistive ink layer onto the surface include the following steps:
    a) silk screening the resistive ink layer onto the surface;
    b) heat curing the resistive ink layer;
    c) silk screening the conductive ink layer onto the surface; and
    d) heat curing the resistive ink layer;
    e) wherein the conductive ink layer comprises a plurality of predetermined shapes substantially repeated along the length of the R-Card and the resistive ink layer comprises a grid-like pattern of lines bordering and separating said predetermined shapes.

10. The method as recited in claim 9, wherein for a desired resistivity taper, the required width of the resistive ink layer lines separating said predetermined shapes and the size of said shapes at any particular location on the R-Card is calculated by the following equation:

$$R = 1/(1/R_{ink})N \tag{1}$$

where R is the resistance, $R_{ink}$ is the resistive value of the hybrid ink in Ohms/Square and N is the number of squares between conductive shapes.

11. The method as recited in claim 10, wherein said predetermined shapes comprise polygons, the maximum size of said polygons being equal to one-tenth of the wavelength of the highest frequency for which the R-Card is employed, and the minimum size of said polygons being equal to one-half the size of the largest polygons.

12. The method as recited in claim 9, wherein said conductive and resistive ink layers are printed onto a substrate material.

13. The method as recited in claim 9, wherein said conductive and resistive ink layers are printed directly onto the part to be covered by the R-Card.

* * * * *